United States Patent [19]

Hood

[11] 3,953,265

[45] Apr. 27, 1976

[54] MENISCUS-CONTAINED METHOD OF HANDLING FLUIDS IN THE MANUFACTURE OF SEMICONDUCTOR WAFERS

[75] Inventor: Roderic Kermit Hood, Williston, Vt.

[73] Assignee: International Business Machines Corporation, Armonk, N.Y.

[22] Filed: Apr. 28, 1975

[21] Appl. No.: 572,570

[52] U.S. Cl. .................................. 156/8; 96/36; 96/36.2; 156/13; 156/17; 156/345
[51] Int. Cl.² ................................. H01L 21/308
[58] Field of Search ................ 156/8, 13, 17, 345; 134/3, 25, 26; 29/580; 96/36, 36.2

[56] References Cited
UNITED STATES PATENTS

| | | | |
|---|---|---|---|
| 3,437,543 | 4/1969 | Winings | 156/17 |
| 3,489,608 | 1/1970 | Jacobs | 134/25 |
| 3,597,289 | 8/1971 | Kohl et al. | 156/17 |
| 3,765,984 | 10/1973 | Strehlow | 156/17 |
| 3,841,930 | 10/1974 | Hetrich | 156/17 |
| 3,874,959 | 4/1975 | Hoekstra et al. | 156/17 |

*Primary Examiner*—William A. Powell
*Assistant Examiner*—Jerome W. Massie
*Attorney, Agent, or Firm*—Bernard M. Goldman

[57] ABSTRACT

The invention relates to a method for reducing the comsumption of etchants used in manufacturing semiconductor devices comprising the steps of supporting a semiconductor wafer, metering a predetermined volume of etchant onto the surface of said wafer to form a meniscus-contained body of etchant thereon, maintaining said wafer static during etching, sensing the completion of said etching, and spinning said wafer upon completion of the etching to remove the etchant from the wafer and terminate the etching operation.

8 Claims, 3 Drawing Figures

MENISCUS-CONTAINED METHOD OF HANDLING FLUIDS IN THE MANUFACTURE OF SEMICONDUCTOR WAFERS

BACKGROUND OF THE INVENTION

This invention relates generally to methods for reducing the consumption of environmentally damaging fluids used in manufacturing integrated semiconductor circuits contained on wafers without any corresponding reduction in quantity or quality of production.

The present invention provides a novel method of handling corrosive fluids which provides significant environmental, engineering, and economic advantages over prior methods of fluid handling during the manufacture of semiconductor devices commonly known as integrated circuits or large scale integration (LSI).

Many different techniques have been developed in the prior art of handling fluids used in the manufacture of semiconductor wafers. Prior techniques generally handled the fluid in a tank, handled it as a spray, or handled it by evaporation. For example, the wafer etching step generally involved immersing a wafer into a bath of hydrofluoric acid etchant, or spraying the etchant, or evaporating the etchant fluid.

Each of these handling methods involves the use of excessive amounts of fluid and can impact the quickness with which the fluids effect on the wafer can be terminated, which can be critical in some manufacturing steps, such as etching. For example, one or more seconds may expire while a wafer is being removed from an immersion bath, which can cause over-etching that may ruin the wafer.

Normally more than one wafer is etched in a bath of etchant, which allows some wafers to underetch and some to overetch as oxide thickness varies from wafer to wafer. This invention allows wafers to be etched one at a time to overcome this problem.

Furthermore, the method of handling the fluid can effect contaminants in the fluid, which can destroy a wafer during a manufacturing step. For example, in order to prevent contamination of the delicate wafer surface during the immersion etching step, prior techniques generally required a total replacement of the etchant bath with each new wafer layer to be etched.

Similarly, the prior immersion and spray handling techniques were wasteful in other manufacturing steps, such as photoresist developing and stripping, by causing the use of excessive amounts of photoresist developer and photoresist stripper.

The etching and other manufacturing steps required the disposal of large quantities of very corrosive fluids, such as hydrofluoric acid (HF), sulfuric acid ($H_2SO_4$), and other environmentally destructive fluids, which needed to be specially handled for disposal by expensive disposal means.

Furthermore, significant amounts of precious metals, such as gold, platinum, and iridium are dissolved by the etching operation at various steps in the wafer layer manufacturing process. The waste fluids are recycled to recover these precious metals. Hence, a reduction in the amount of waste fluids reduces the recycling recovery costs.

Accordingly, this invention is directed at significantly reducing the initial cost of the processing fluids and the large investment and maintenance costs needed to provide the means for recovering precious materials in the fluid waste, and for the environmental disposal corrosive waste materials resulting from the use of the fluids in integrated circuit manufacture.

SUMMARY OF THE INVENTION

The subject invention has particular application in the handling of the corrosive materials needed for photoresist developing, etching and stripping operations, while maintaining high standards of both quality and quantity of production of semiconductor wafers. It has been found that the corrosive materials used in these operations, such as hydrofluoric acid, sulfuric acid, potassium hydroxide, etc., can be reduced to less than 1/10th of their former quantities through the use of the subject invention, while obtaining improved production goals. For example, the subject invention has been found to handle the required etching of a resist-defined layer on a three and one-fourth inch diameter semiconductor wafer using as little as 12 cc (cubic centimeters) of buffered HF etch solution to provide a fluid thickness of 2.2 millimeters; while the prior immersion etching process averaged 150 centimeters of the same etch fluid per wafer of the same size. The same relative saving was found in the use of the stripping solution, and of resist developer solution.

This invention provides the best match found to date in the quantity of etchant in relation to the amount, speed, and quality and quantity of the etched result.

The subject invention includes the discovery that a meniscus-contained body of etchant fluid provides excellent control for forming resist masked upper surfaces of a wafer. Experiments have shown that precision and uniformity of etched line depth and width across the wafer surface equal or exceed the best precision and uniformity found with dip etching processes which uses over 10 times the amount of etch fluid used by the invention and which require more processing stations for the wafer during integrated circuit manufacturing. No adverse side-effects have been noted in the etching process using this invention such as due to lack of agitation of the etchant fluid, including no problems from clinging air bells on the wafer surface which prior etching theories might expect.

A resultant feature of this invention is that it also enables high through-put in semiconductor device manufacturing by enabling greater efficiency in semiconductor manufacturing processes. In particular, the invention enables the consolidation of several different steps of the manufacturing process to a single manufacturing location, where previously a wafer had to be moved to several different locations for the same steps, resulting in slower manufacturing and greater manufacturing time, equipment, and building. Thus, the inventions ability to perform more processing steps while the wafer is at a single location can significantly increase the through-put of semiconductor integrated circuit manufacturing.

It is therefore a primary object of this invention to provide a new method of handling operating fluids which process a wafer surface during the manufacture of electronic semiconductor circuits to greatly reduce the amount of operating fluids needed.

It is another object of this invention to provide a novel etching process which improves etching quality by providing a more precise termination of an etching operation than any prior etching process. The invention enables the very fast application of centrifugal force to provide precise termination of an etching operation when compared to the slow termination in the prior immersion or an evaporation etching methods.

It is also an object of the subject invention to provide an etching method which enables the accurate use of light reflecting or other types of the etching-end-point detection means. The invention permits the most sensitive end-of-etch detection means to be used, and permits very fast etch termination response to and end signal from the etch-end-point detection means. The etching time is very critical with many types of layers on a semiconductor wafer, because the layer thinness is generally measured in Angstroms (A), and a slight amount of overetching time can ruin the layer by cutting away too much layer material. The etching step has been ended by a timed period, and more recently by etchant end point detectors.

Still another object of this invention is to provide a processing method which enables significant simplification in the tools needed to perform the sequence of resist development, etching, and resist stripping steps, compared to tools needed by prior etching techniques. This tool simplification is in addition to the advantage of requiring very small amounts of operating fluids. This reduction also includes the size of tanks required to store development, etching, and stripping fluids, an avoidance of recirculation equipment for reprocessing used fluids, and a great reduction in waste processing equipment.

The subject invention enables single location processing for a wafer by permitting more steps to be performed at a single location in the semiconductor wafer manufacturing operation than is found in prior manufacturing processs for making semiconductor circuits, such as the steps of resist stripping after etching, and washing and drying the wafer in preparation for the steps of adding the next layer to the wafer surface, and repeating these steps for each deposited layer in the overall process until the manufacturing is completed for a semiconductor integrated circuit wafer. Accordingly, the invention is particularly adaptable to the automated production of semiconductor circuits, and can easily accommodate wafers of different sizes by changing the metering of the quantity of fluids provided at the required steps in the operation.

The invention can therefore reduce the amount of transportation needed for a wafer during the integrated circuit manufacturing process compared to the transportation requirements in current manufacturing processes, since the invention permits a sub-grouping of steps at a single location, where prior processing required wafer transportation between multiple locations for this subgroup of steps.

The invention also eliminates a need for backside protection for a wafer being etched or stripped (as is currently required by immersion or evaporation process) since the backside of the wafer is not exposed to the etching or stripping fluids during use of the invention.

The primary feature of this invention is in the discovery that, in particular, the successful etching step can be done by a small amount of static fluid held by surface tension forming a meniscus boundary around a body of fluid provided to the edges of the upper surface of a horizontally supported semiconductor wafer. This meniscus-contained fluid body has been found to perform chemical etching without the agitation previously thought essential for gas bubble removal on the etching of precision microscopic surfaces. The meniscus boundary is aided by the sharp edges of a wafer, which react with the fluid surface tension to allow a wide tolerance in the volume of fluids that may be poured onto the wafer surface for wetting the entire upper surface and yet not overflowing the wafer edges. The meniscus-contained body, for example, has been found to meet these requirements with as little as 12 and as much as 22 cubic centimeters of buffered HF etchant on a three and ¼ inch diameter wafer without overflowing the wafer edge yet covering the entire upper wafer surface to its edges for all volumes between these limits. Wetting agents have been found to affect the volume limits when using this invention.

The detailed embodiment of the inventive process places the wafer on a horizontally-supported rotatable table, such as provided by a centrifugal or vacuum chuck, and performs the meniscus controlled development, etching, and stripping steps while the wafer is statically held non-rotationally by chuck. After the meniscus-contained fluid is applied and at the instant its use is sensed to be complete, the meniscus bound fluid is rapidly removed from the wafer by suddenly rotating the table with the wafer by energizing a motor, so that centrifugal force rapidly breaks the meniscus and removes the liquid from the wafer surface. Whether spinning or stationary, water or other rise liquids may be squirted or sprayed on the wafer to wash it.

In this manner, a summary listing of static and rotational steps which may be performed on a semiconductor wafer at a single manufacturing location are:

1. Photoresist development with meniscus-contained body (static).
2. Stop development and rinse (rotational).
3. Dry (rotational).
4. Bake (static).
5. Etch with meniscus-contained body (static).
6. Stop etch and rinse (rotational).
7. Strip the resist with meniscus-contained body (static).
8. Stop strip and rinse (rotational).
9. Dry (rotational).

The static spindle method of meniscus-contained etching of this invention has been successfully accomplished on many different types of layers deposited on a silicon wafer, such as oxide and polysilicon surfaces, doped oxide, polysilicon, nitride, thin oxide, thick oxide, aluminum, and sputtered quartz.

The foregoing and other objects, features and advantages of the invention will be more apparent from the following more particular description of the preferred embodiments of the invention illustrated in the accompanying drawings of which:

Detailed Embodiment

Figure 1A:
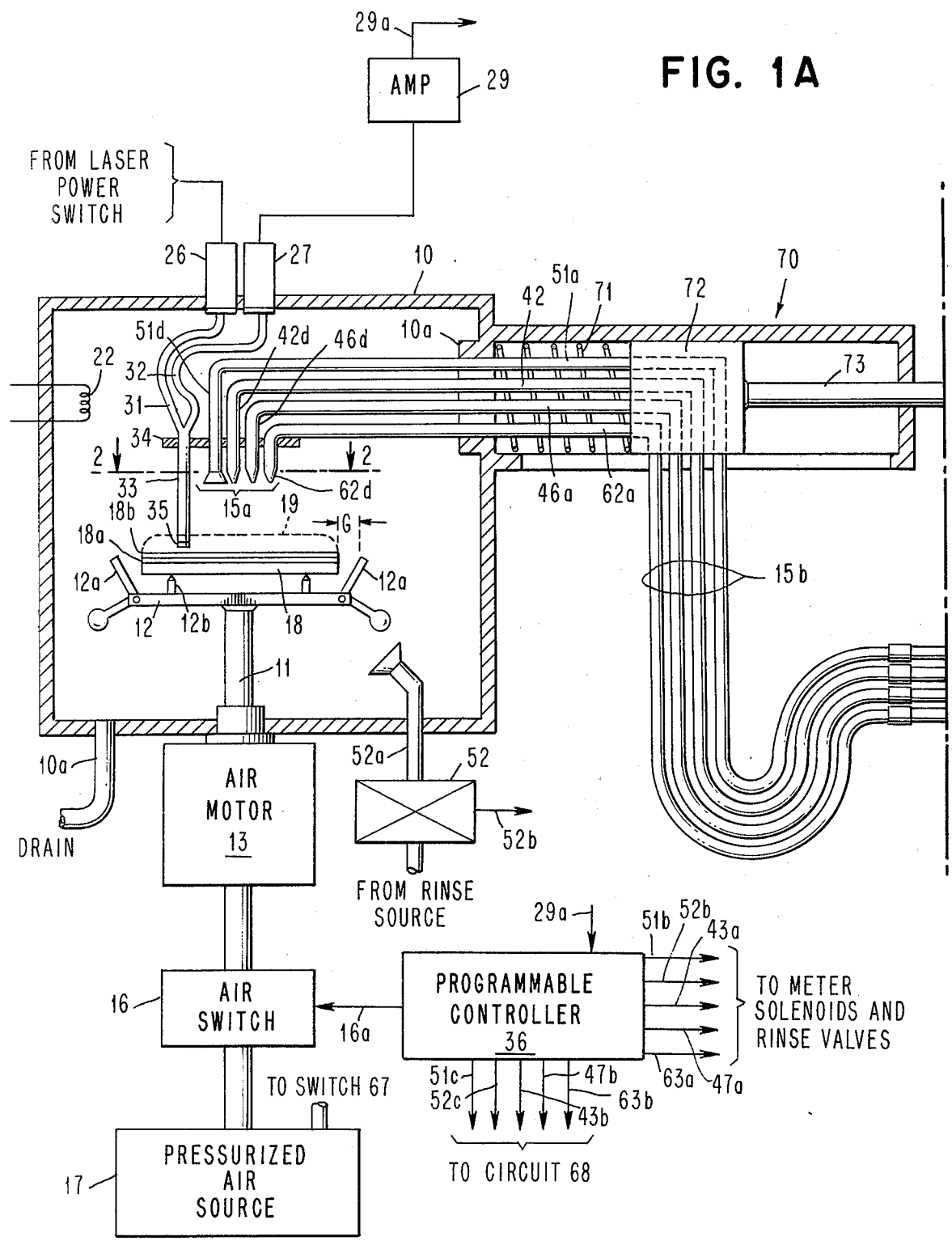
FIGS. 1A and 1B show schematically a processing station for performing an embodiment of this invention.

The invention is based on the use of meniscus-contained fluid bodies applied to the surface of a stationary semiconductor wafer having a developed or undeveloped photoresist overlay during integrated circuit manufacture. The wafer is positioned horizontally during the use of the static meniscus-contained fluid body. There are a number of important parameters involved in minimizing the amount of fluid materials in a meniscus-contained body involved in the steps of photoresist developing, acid etching, and alkali stripping. The parameters include temperature, fluid surface tension, and proportion of wetting agent used in a fluid.

Experimentation with meniscus-contained fluid bodies has found that with a given fluid, there is a minimum volume required to cover a wafer, and there is a maximum volume beyond which the meniscus boundary is broken and fluid overflows the wafer edge. The overflow is wasted fluid.

The proportion of wetting agent used has a significant effect upon the minimum and maximum volume limits in a meniscus-contained body on a given wafer surface. For example, it was found that without any wetting agent in buffered HF etchant and using a 3 and ¼ inch diameter wafer with a developed photoresist surface, it took a minimum of 23 cc (cubic centimeters) to fully cover the wafer with a meniscus-contained fluid body, and that overflow began when the body volume exceeded 29 cc maximum. This provided a 6 cc variation in the volume of fluid in the meniscus-contained body for obtaining full surface coverage without overflow.

However, when approximately 1 per cent of commercial wetting agent was mixed in the same type of buffered HF etchant, it was found that the minimum volume of etchant in the fluid body was reduced to 12 cc for covering the wafer, and that the maximum volume was 14 cc at which overflow began. Hence, the addition of about 1 per cent wetting agent reduced the consumption of etchant in the meniscus-contained body by a factor of about 50 per cent.

Nevertheless, it was found that the amount of wetting agent cannot be increased indefinitely in order to continuously reduce the volume of fluid in a fluid body. This is because meniscus containment is lost when the wetting agent exceeds a particular value for any given fluid, at which overflow can occur over some edge before the entire wafer surface is covered, which can result in a coverage failure for the given step and a failure in the manufacturing process. That is, failure to cover an area of the wafer with etchant causes failure of the manufacturing process because required etching on the uncovered surface cannot be done.

Accordingly, if wetting agent is to be used, an operable proportion must be chosen for each given operating fluid. An operable proportion of wetting agent maintains sufficient surface tension in the fluid to permit the fluid to form a meniscus-contained body over the entire surface of the wafer without any overflow. The optimum proportion of wetting agent is a porportion slightly below the lowest proportion which causes coverage failure.

It was also found that in no case was the volume of buffered HF in any meniscus-contained fluid body insufficient to perform the required amount of etching at the required rate of etch. Experiments have shown that the amount of etchant used in etching a developed pattern on a 3 and ¼ inch wafer is only a small fraction of 1 cc; and in all observed cases, the optimum volume permitted by the wetting agent exceeded the volume requirement for the amount and rate of etch. (The rate of etch of the surface is determined by the strength of the etchant and its temperature, which is at room temperature or sometimes elevated. Room temperature and elevated temperature are used for different types of oxides to be etched.)

Figure 1B:
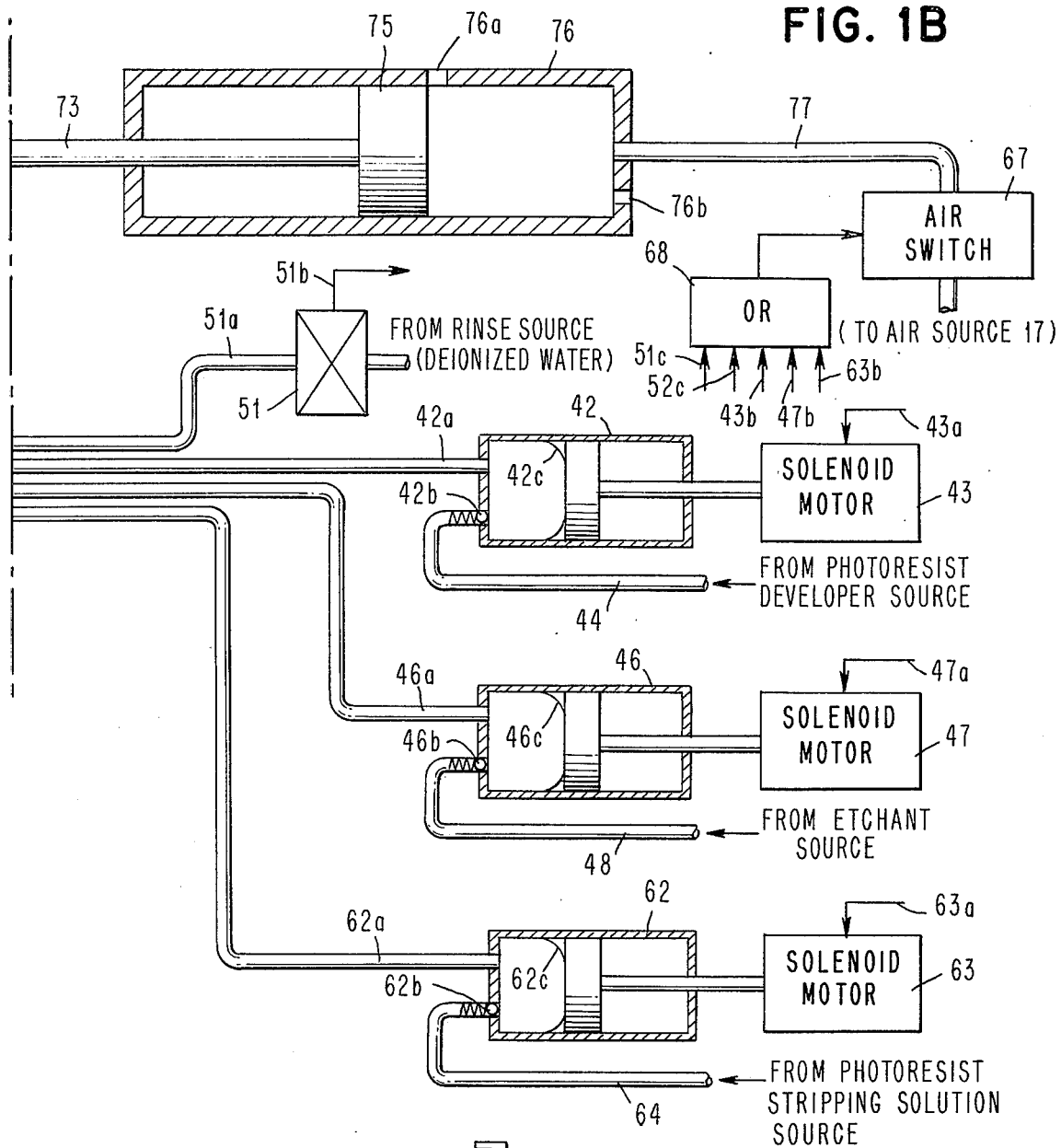

FIGS. 1A and 1B illustrate an arrangement which can accommodate several manufacturing steps that use meniscus-contained fluid bodies on a silicon wafer 18 at a single location in a processing chamber 10. The accommodated steps include photoresist development, etching, etching-end-point-detection, etchant removal, photoresist stripping, washing and drying. Then the wafer can be moved to another location for a next film deposition, photoresist application, and image projection, after which the wafer with the new layer and photoresist may be moved back to the location shown in FIG. 1A where the same process steps may be repeated on the newly deposited layer to form it into the shape determined by the exposed image pattern on the photoresist surface. Over half a dozen different types of layers are normally deposited and etch-formed on a wafer surface during the manufacture of an integrated circuit. Therefore, the wafer may be periodically returned to the location shown in FIG. 1A to cut the new layer in accordance with the resist image and prepare it for the next layer required in the manufacture of the semiconductor integrated circuits.

In more detail in FIGS. 1A and 1B, processing chamber 10 receives a semiconductor wafer 18 on three support pegs 12b in a centrifugal chuck 12, so that wafer 18 is supported horizontally thereon. A pressurized air source 17 is communicated to an air motor 13 by an electrically-controlled air valve switch 16 to controllably rotate shaft 11 and its connected chuck 12. Valve switch 16 can quickly supply or shut off the pressurized air to motor 13 in response to an electrical signal on a lead 16a provided from a programmable controller 36. The air motor 13 starts with very high acceleration. When valve 16 is shut off to stop rotation, and wafer 18 is left statically centered in chuck 12, with each of the three centrifugal arms 12a withdrawn from wafer 18 by a distance G, which is about one-fourth of an inch or greater due to the counterweight. Distance G is sufficient to prevent the surface attaction by the material in arms 12a from exerting any significant force on any meniscus-contained fluid body on wafer 18, which would tend to interfer or destroy the meniscus-contained fluid body.

Figure 2:
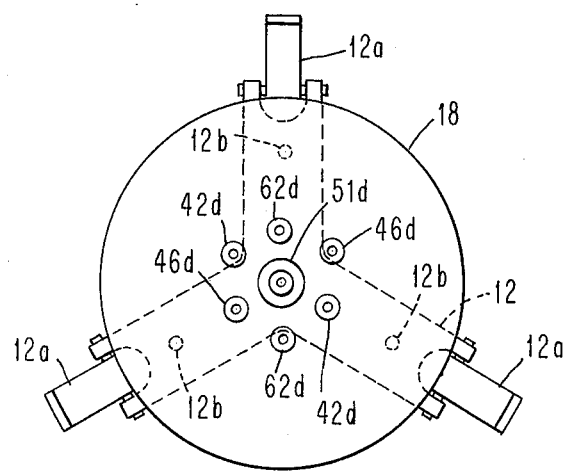
FIG. 2 is section view A—A in FIG. 1.

Centrifugal chuck 12 is generally Y shaped, as is seen in FIG. 2, with the three short support pins 12b projecting upwardly upon which wafer 18 rests. The outer three ends of chuck 12 pivotably support the three centrifugal arms 12a which are heavier on their bottom part below the pivot than on their top part above the pivot, so that rotation of table 12 forces the bottom ends of the arms 12a to move outwardly. Hence, the upper parts of arms 12a move inwardly against wafer 18 to hold it in a central position on table 12 while it is rotating. When chuck 12 is not rotating, the upper part of arms 12a are positioned away from a centered wafer 18 by distance G due to the angular shape of arms 12a.

This embodiment assumes that prior to the use of chamber 10, the conventional photoresist overlay has previously been applied evenly to the upper surface of wafer 18 and hardened by conventional means, and that the photoresist surface was exposed to an ultraviolet image by photographic means using either a projector or a glass mask. The exposed image determines the form to be cut into the deposited layer immediately beneath the photoresist by the next etching step.

Then the method of this embodiment begins by moving a set of nozzles 15a over wafer 18. Normally the nozzles are located to the right of wafer 18 in FIG. 1A, so that drippage from any nozzle can not fall onto the wafer surface. The set of nozzles 15a are moved over wafer 18 by applying pressurized air into a cylinder 76 in FIG. 1B by electrically energizing an air switch 67. Air actuated piston 75 is driven by air pressure applied through tube 77, connecting rod 73, and a nozzle-actuating block 72, which is fixed to the set of nozzles 15a whenever any nozzle in the set is to pass fluid to the wafer surface. The piston stops at a predetermined position with the nozzles over wafer 18 when piston 75 uncovers cylinder opening 76a which causes the air pressure in the cylinder to drop to a point where piston 75 can not move further against the bias of spring 71. As soon as the fluid is completely dispensed from any nozzle, air switch 67 is turned off by de-energizing switch 67, and the set of nozzles is moved away from over the wafer 18 under bias of spring 71 as the air pressure in cylinder 76 dissipates through a small cylinder bleeder opening 76b.

The nozzle set 15a is rigidly supported with respect to coupling block 72 in a slidable manner through opening 10a in chamber 10. A flexible section of tubing 15b is provided to enable the required movement by the nozzle set 15a.

While the nozzle set 15a is over wafer 18, a metered amount of a commercial photoresist developer is applied via a metering cylinder 42 onto the photoresist surface through nozzles 42d (seen also in FIG. 2) connected to a tube 42a. Fluid meter 42 provides the precise quantity needed to form a meniscus-contained fluid body 19 on the photoresist surface of wafer 18 from edge-to-edge without overlfow. This quantity of developer has been found to be more than sufficient to develop the ultra-violet exposed image in the photoresist surface. Fluid meter 42 contains a piston driven by a solenoid motor 43. When activated, the piston squeezes a flexible plastic envelope 42c containing photoresist developer fluid which is forced through tube 42a and nozzle 42d onto the surface of wafer 18. After actuation, the piston returns to its original position under solenoid return spring actuation to thereby expand plastic envelope 42c and draw into it a measured quantity of developer through a unidirectional valve 42b from a tube 44 connected to a photoresiist developer source, such as a tank of the developer.

When photoresist developing is completed, the set of nozzles 15a is again moved over the wafer 18, and valve 51 is actuated to spray rinse fluid, which is deionized water, from nozzle 51d to wash away the loose photoresist material remaining after development is completed. Then motor 13 is actuated to spin off the loose matter and spray. Then, a baking element 22 may be actuated to dry and further harden the newly exposed edges in the remaining photoresist material.

Motor 13 is now stopped and wafer 18 is again static (no velocity). Then a metered-quantity of etchant, such as buffered hydrofluoric acid (HF) having an optimum proportional amount of wetting agent, as determined in the manner describied above, is provided to the photoresist developed surface of wafer 18 by metering cylinder 46 to form a meniscus-contained etchant fluid body 19 without overflow. This is done in FIG. 1A by actuating solenoid motor 47 in FIG. 1B to move the metered quantity of etchant through tube 46a and its nozzle to the surface of wafer 18 to form the meniscus-contained fluid body 19. Metering devices 46, 47 is the same as metering device 42, 43 previously described.

As soon as body 19 is formed of etchant, the air switch 67 remains activated to cause nozzles 15a with an EEP detector 33 to remain over wafer 18. Then the EEP detector system has tip 35 in contact with the etchant body 19, and the detector is enabled by energizing a laser 26 to transmit light through fiber optics 31 to the surface of wafer 18 from which it is reflected through fiber optics 32 to a photo transistor or a light detector 27.

The fiber optics bundles 31 and 32 are flexible to permit lateral movement of the tip 35, which is located at the end of the combined bundle 33 supported by bracket 34 fixed to nozzle set 15a. The tip 35 comprises a polycarbonate lens supported by a fluid tight plastic sleeve at the end of fiber bundle 33 to protect the fibers from the etchant; otherwise the etchant would destroy the light passing ability of the ends of the fibers if they were allowed to directly contact the etchant, and this would make the EEP detector system inoperable.

The EEP detector 27 receives the light through bundle 32, and it generates a signal proportional to the amount of light reflected from the surface being etched. The output of amplifier 29 is provided on lead 29a to programmable controller 36. When the amplifier signal stops undulating and becomes constant, these conditions indicate the end of etching and controller 36 electrically actuates air switch 16 to quickly start rotation of motor 13 and wafer 18 to rapidly apply centrifugal force to the meniscus-contained fluid body 19 which immediately breaks it up and throws it off of wafer 18 onto the inner walls of chamber 10 frrom which it flows into drain 10a for disposal. Concurrently, outputs are provided on lines 51b and 52b by controller 36 to energized valves 51 and 52 to apply rinse fluid onto the upper and lower surfaces of wafer 18 to cleanse any possible remaining etchant or foreign matter. Wafer 18 may continue spinning under actuation of motor 13 while the rinse fluid is being applied. The etching operation is now completed for the last layer deposited on wafer 18 to which the current photoresist overlay is applied.

The set of nozzles 15a and the EEP detector 27 are at this time moved to the right of wafer 18 under bias of spring 71 by discontinuing the signal on air switch 67.

An example of an EEP detector system is published in the IBM Technical Disclosure Bulletin, April 1973, Page 3532, entitled "Etch End-Point Detector" by R. N. Price.

When the etching operation is completed, the existing photoresist matter on the wafer surface must be removed by a stripping operation in preparation for subsequent steps which will deposit the next layer onto wafer 18. The stripping operation is done also by depositing another meniscus-contained body 19 of stripping fluid, such as hot sulfuric acid ($H_2SO_4$), by actuating a solenoid 63 which actuates a piston in a metering cylinder 62 to force a required volume of stripping fluid through tube 62a and its nozzles 62d to form a meniscus-contained fluid body 19 on the wafer surface in a similar manner to that previously described for the metering of fluids by cylinders 42 and 46. Upon completion of the stripping operation, determined by a time-out in controller 36 when all the remaining resist is loosened or dissolved, motor 13 is energized and the stripping fluid body 19 is instantly removed by centrifugal force in the manner previously described. Rinse fluid is then turned on by controller 36 energizing lines 51b and 52b to wash away any remaining contaminants on the top and bottom surfaces of wafer 18, and heating element 22 is turned on to dry the wafer.

The wafer may now be removed from chamber 10 to perform the steps that provide the next layer on wafer 18, after which the wafer may be returned to chamber 10 to repeat all of the above described operations to form the next layer, etc. until manufacturing is completed for the wafer.

While the invention has been particularly shown and described with reference to a preferred embodiment thereof, it will be understood by those skilled in the art that the foregoing and other changes in form and detail may be made therein without departing from the spirit and scope of the invention.

What is claimed is:

1. A method of static etching a deposited layer on a semiconductor wafer, said layer having a developed photoresist pattern engaging its upper surface, comprising, supporting said wafer in a horizontal position with the layer to be etched being located on the upper side of said wafer, metering a predetermined volume of an etchant solution onto the upper surface of said wafer to flow over the entire upper surface up to all edges of said wafer to form a meniscus-contained body of etch solution, statically maintaining said meniscus-contained body while the etch process proceeds towards completeion, sensing the completion of etching by means of an etching end point detector, spinning said waffer to apply centrifugal force to the body of the etch solution immediately upon said sensing step indicating the completion of etching to thereby remove the etchant solution from said wafer and immediately terminate the etching operation.

2. A static etching method as defined in claim 1 in which, said supporting step comprises a motor drive spindle having a horizontal supporting platform connected to its upper end for receiving a wafer in a horizontal position, maintaining said supporting platform in a motionless condition during the metering, statically maintaining, and sensing steps for performing the etching operation, and said spinning step switching power to said motor driven spindle in response to the sensing step to rapidly spin off the body of etchant solution from said wafer by the centrifugal force of rotary motion.

3. A static etching method as defined in claim 1 further comprising, supporting liquid dispersing means for dispersing said etchant solution and a wash solution, said metering step applying a volume of etchant solution onto the static upper surface of said wafer, the volume not exceeding an amount of the solution which covers the entire wafer surface up to the edges of the wafer with the boundaries on said solution supported by the meniscus of said solution, wherein the volume does not cause any overflow of etchant solution over the edges of said wafer.

4. A static etchant method as defined in claim 1 further comprising, said sensing step using a light source to provide a light beam through fiber optics passing downwardly through the meniscus-contained fluid body of etchant solution, being reflected by the surface of said wafer to other fiber optics, detecting with a light detector the reflected light rays received through the other fiber optics, the detector providing an electrical signal output, monitoring the changes in the electrical signal output to sense when the signal stops undulating to indicate to the spinning step when the end of the static etching of the deposited layer is completed.

5. A static etchant method as defined in claim 4, further comprising, supporting a polycarbonate lens in a fluid-proof manner at the end of said fiber optics, with said lens submersed in said body of etchant solution, but said lens is not in contact with the wafer surface.

6. A method of static etching as defined in claim 1, prior to said supporting step, further comprising, preparing an etchant solution with a wetting agent contained in a proportion to provide a surface tension in the fluid that allows the solution to spread over the surface of the wafer and stop at every edge, whereby a meniscus-contained fluid body of etchant solution is formed before any part of said fluid overflows any edge of said wafer.

7. A method as defined in claim 6 in which the proportion of wetting agent in the etchant solution is slightly below a lowest proportion of said wetting agent which causes uncontrollable edge overflow.

8. A method of greatly reducing the amount of corrosive operating fluids used in the course of manufacturing integrated circuits at each of plural stages in the manufacture of an integrated circuit in which at each stage an oxide or metal layer is deposited with a photoresist layer being applied thereover and a shape-determining image thereon, comprising the steps of supporting said wafer in a processing chamber in a horizontal position on a platform which can be rapidly rotated with said wafer, the photoresist layer being on the top side of said wafer, firstly metering a predetermined volume of photoresist developing solution onto the upper surface of said wafer to form a meniscus-contained fluid body over the entire upper surface of said wafer while said wafer and platform are in a stationary state, firstly statically maintaining said platform and wafer which the meniscus-contained body of developer fluid until the end of a development period, firstly rotating said supporting platform with said wafer to remove the body of the developing fluid, and firstly spraying said wafer with a washing solution, secondly metering a predetermined volume of an etchant solution onto the upper surface of said wafer to flow over the entire upper surface of said wafer to all edges of said wafer to form a meniscus-contained body of etchant solution while said wafer and platform are in a stationary state, secondly rotating said wafer immediately upon the completion of etching to rapidly terminate the etching operation, and secondly spraying said wafer with a washing solution, thirdly metering a predetermined volume of photoresist stripping solution onto the upper surface of said wafer to flow over the entire upper surface to all edges of said wafer to form a meniscus-contained body of stripping solution while said wafer and platform are in a stationary state, thirdly statically maintaining said meniscus-contained body of stripping fluid until the stripping process is completed, thirdly rotating said wafer upon the completion of said stripping step to remove the stripping solution from said wafer, thirdly spraying said wafer with a wash solution, and thirdly spinning said wafer to dry it.

* * * * *